(12) United States Patent
Yang et al.

(10) Patent No.: US 7,825,476 B2
(45) Date of Patent: Nov. 2, 2010

(54) METHOD OF FABRICATING POLYCRYSTALLINE SILICON, TFT FABRICATED USING THE SAME, METHOD OF FABRICATING THE TFT, AND ORGANIC LIGHT EMITTING DIODE DISPLAY DEVICE INCLUDING THE TFT

(75) Inventors: Tae-Hoon Yang, Suwon-si (KR); Ki-Yong Lee, Suwon-si (KR); Jin-Wook Seo, Suwon-si (KR); Byoung-Keon Park, Suwon-si (KR); Kil-Won Lee, Suwon-si (KR)

(73) Assignee: Samsung Mobile Display Co., Ltd., Yongin-si (KR)

( * ) Notice: Subject to any disclaimer, the term of this patent is extended or adjusted under 35 U.S.C. 154(b) by 48 days.

(21) Appl. No.: 12/142,210

(22) Filed: Jun. 19, 2008

(65) Prior Publication Data
US 2008/0315207 A1    Dec. 25, 2008

(30) Foreign Application Priority Data
Jun. 19, 2007    (KR) .................... 10-2007-0059968

(51) Int. Cl.
*H01L 23/62*    (2006.01)
(52) U.S. Cl. ................. 257/359; 257/288; 257/347; 257/E21.17; 257/E21.32; 257/E21.82; 257/E21.324; 257/E21.334; 257/E21.562; 257/E21.571; 257/E21.632
(58) Field of Classification Search ............ 257/347, 257/359, 381, 288, 377, 538, 914, E21.17, 257/32, 82, 324, 334, 562, 571, 632
See application file for complete search history.

(56) References Cited
U.S. PATENT DOCUMENTS
5,643,826 A * 7/1997 Ohtani et al. ............... 438/162

(Continued)

FOREIGN PATENT DOCUMENTS
CN    1132927 A    10/1996

(Continued)

OTHER PUBLICATIONS
Office Action issued in Chinese Patent Application No. 2008101285328 on Jun. 19, 2009.

(Continued)

*Primary Examiner*—David Nhu
(74) *Attorney, Agent, or Firm*—Stein McEwen, LLP

(57) ABSTRACT

A method of fabricating a polycrystalline silicon (poly-Si) layer includes providing a substrate, forming an amorphous silicon (a-Si) layer on the substrate, forming a thermal oxide layer to a thickness of about 10 to 50 Å on the a-Si layer, forming a metal catalyst layer on the thermal oxide layer, and annealing the substrate to crystallize the a-Si layer into the poly-Si layer using a metal catalyst of the metal catalyst layer. Thus, the a-Si layer can be crystallized into a poly-Si layer by a super grain silicon (SGS) crystallization method. Also, the thermal oxide layer may be formed during the dehydrogenation of the a-Si layer so that an additional process of forming a capping layer required for the SGS crystallization method can be omitted, thereby simplifying the fabrication process.

7 Claims, 13 Drawing Sheets

U.S. PATENT DOCUMENTS

| | | | |
|---|---|---|---|
| 5,840,600 A | | 11/1998 | Yamazaki et al. |
| 5,854,096 A | * | 12/1998 | Ohtani et al. ............... 438/166 |
| 6,162,667 A | * | 12/2000 | Funai et al. ................. 438/166 |
| 6,346,437 B1 | | 2/2002 | Maekawa et al. |
| 6,465,287 B1 | * | 10/2002 | Yamazaki et al. .......... 438/162 |
| 7,470,575 B2 | * | 12/2008 | Ohtani et al. ............... 438/166 |
| 2003/0034940 A1 | | 2/2003 | Yamazaki et al. |
| 2006/0030085 A1 | | 2/2006 | Park et al. |
| 2006/0033106 A1 | | 2/2006 | Seo et al. |
| 2006/0033107 A1 | | 2/2006 | Lee et al. |

FOREIGN PATENT DOCUMENTS

| | | |
|---|---|---|
| CN | 1223459 A | 7/1999 |
| EP | 651 431 A | 5/1995 |
| JP | 7-94756 | 4/1995 |
| JP | 7-130652 | 5/1995 |
| JP | 7-226374 | 8/1995 |
| JP | 11-231798 | 8/1999 |
| JP | 11-312812 | 11/1999 |
| JP | 11-354441 | 12/1999 |
| JP | 2002-368010 | 12/2002 |
| JP | 2003-68645 | 3/2003 |
| JP | 2003-197618 | 7/2003 |
| JP | 2006-54415 | 2/2006 |
| JP | 2007-142367 | 6/2007 |
| KR | 2004-40762 | 5/2004 |
| KR | 10-0478757 | 3/2005 |
| KR | 2005-25239 | 3/2005 |
| KR | 2006-15195 | 2/2006 |
| KR | 2007-41240 | 4/2007 |

OTHER PUBLICATIONS

Office Action issued in Korean Patent Application No. 10-2007-0059968 on Jul. 10, 2009.

Office Action issued by Korean Patent Office in Korean Patent Application No. 2007-59968 on Sep. 24, 2008.

Search Report issued by European Patent Office in European Patent Application No. 08158539.0 on Dec. 3, 2008.

* cited by examiner

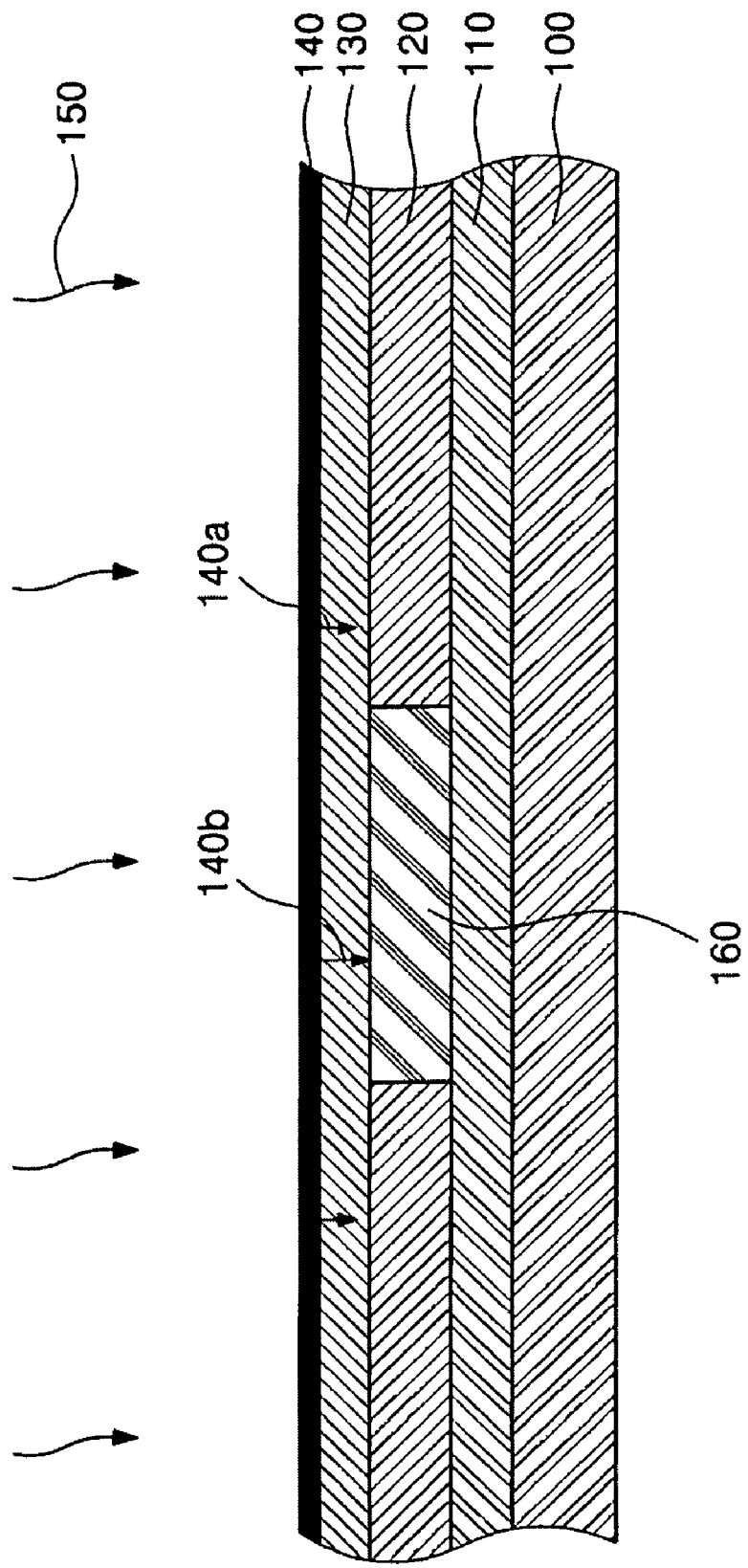

METHOD OF FABRICATING POLYCRYSTALLINE SILICON, TFT FABRICATED USING THE SAME, METHOD OF FABRICATING THE TFT, AND ORGANIC LIGHT EMITTING DIODE DISPLAY DEVICE INCLUDING THE TFT

CROSS-REFERENCE TO RELATED APPLICATION

This application claims the benefit of Korean Patent Application No. 2007-59968, filed Jun. 19, 2007, in the Korean Intellectual Property Office, the disclosure of which is incorporated herein by reference.

BACKGROUND OF THE INVENTION

1. Field of the Invention

Aspects of the present invention relate to a method of fabricating a polycrystalline silicon (poly-Si) layer, a thin film transistor (TFT) fabricated using the same, a method of fabricating the TFT, and an organic lighting emitting diode (OLED) display device including the TFT. More particularly, aspects of the present invention relate to a method of fabricating a poly-Si layer, in which a thermal oxide layer is formed to a thickness of about 10 to 50 Å on an amorphous silicon (a-Si) layer so as to crystallize the a-Si layer into a poly-Si layer using a super grain silicon (SGS) crystallization method, a TFT fabricated using the same, a method of fabricating the TFT, and an OLED display device including the TFT. In the method, an additional process of forming a capping layer typically required for the SGS crystallization method may be omitted.

2. Description of the Related Art

In general, a polycrystalline silicon (poly-Si) layer is widely used as a semiconductor layer for a thin film transistor (TFT) because the poly-Si has a high field-effect mobility, can be applied to a high-speed operating circuit, and can used to configure a complementary-metal-oxide-semiconductor (CMOS) circuit. A TFT using a poly-Si layer is typically used as an active device of an active-matrix liquid crystal display (AMLCD) or a switching device or a driving device of an organic light emitting diode (OLED).

Methods of crystallizing an a-Si layer into a poly-Si layer may include a solid phase crystallization (SPC) method, an excimer laser crystallization (ELC) method, a metal induced crystallization (MIC) method, and a metal induced lateral crystallization (MILC) method. In the SPC method, an a-Si layer is annealed for several to several tens of hours at temperatures below 700° C., the temperature at which the glass substrate typically used in a TFT for a display device is transformed. In the ELC method, excimer laser beams are irradiated onto an a-Si layer so that the a-Si layer is partially heated to a high temperature in a very short amount of time. In the MIC method, a metal such as nickel (Ni), palladium (Pd), gold (Au), or aluminum (Al) is brought into contact with or doped into an a-Si layer to induce a phase change of the a-Si layer into a poly-Si layer. In the MILC method, silicide formed by reaction of metal with silicon laterally diffuses so as to sequentially induce crystallization of an a-Si layer.

However, the SPC method takes too much time and may lead to deformation of the substrate because the substrate is annealed at a high temperature for a long time. The ELC method requires expensive laser apparatuses and results in the formation of protrusions on the poly-Si surface, thereby degrading interfacial characteristics between a semiconductor layer and a gate insulating layer. When the MIC or MILC method is employed, a large amount of metal catalyst may remain in a crystallized poly-Si layer, thereby increasing leakage current of the semiconductor layer of a TFT.

Recently, a vast amount of research has been conducted on methods of crystallizing an a-Si layer using a metal catalyst in order to crystallize the a-Si layer at a lower temperature and in a shorter amount of time than in an SPC method. Typical methods of crystallizing an a-Si layer using a metal catalyst are the MIC method and the MILC method mentioned above. In these methods, however, the device characteristics of a TFT may be degraded due to contamination caused by the metal catalyst.

In order to prevent the contamination caused by the metal catalyst, a super grain silicon (SGS) crystallization method has been developed. In the SGS crystallization method, the amount of metal catalyst that diffuses into the a-Si layer is controlled to provide a low concentration of the metal catalyst in the a-Si layer. Because the metal catalyst is spaced apart at a low concentration in the a-Si layer, the size of crystal grains that are catalyzed by the metal catalyst ranges from several to several hundred μm. Typically, the SGS crystallization method may include forming a capping layer to control diffusion of the metal catalyst into the a-Si layer, forming a metal catalyst layer on the capping layer, and annealing the metal catalyst layer so that a low concentration of the metal catalyst diffuses through the capping layer and into the a-Si layer, and then crystallizing the a-Si layer into a poly-Si layer.

However, the above-described SGS crystallization method involves an additional process of forming a capping layer, which is typically carried out using a chemical vapor deposition (CVD) technique or a physical vapor deposition (PVD) technique, thereby complicating the fabrication process of the poly-Si layer.

SUMMARY OF THE INVENTION

Aspects of the present invention provide a method of fabricating a polycrystalline silicon (poly-Si) layer, in which a super grain silicon (SGS) crystallization method is performed without an additional process of forming a capping layer, a thin film transistor (TFT) fabricated using the same, a method of fabricating the TFT, and an organic light emitting diode (OLED) display device including the TFT.

According to an embodiment of the present invention, a method of fabricating a polycrystalline silicon (poly-Si) layer by a super grain silicon (SGS) crystallization method without forming a capping layer includes thermally oxidizing a surface of an amorphous silicon (a-Si) layer to form a thermal oxide layer on the a-Si layer; forming a metal catalyst layer directly on the thermal oxide layer; and annealing the a-Si layer having the thermal oxide layer and metal catalyst layer formed thereon such that a controlled amount of metal from the metal catalyst layer diffuses through the thermal oxide layer to catalyze a crystallization of the a-Si layer into the poly-Si layer.

According to another embodiment of the present invention, a method of fabricating a poly-Si layer includes: providing a substrate; forming an amorphous silicon (a-Si) layer on the substrate; forming a thermal oxide layer to a thickness of about 10 to 50 Å on the a-Si layer; forming a metal catalyst layer on the thermal oxide layer; and annealing the substrate to crystallize the a-Si layer into the poly-Si layer using a metal catalyst of the metal catalyst layer.

According to another embodiment of the present invention, a TFT includes a substrate; a semiconductor layer disposed on the substrate and crystallized using a metal catalyst for crystallization; a thermal oxide layer disposed on the semiconductor layer and having a thickness of about 10 to 50 Å; a gate insulating layer disposed on the thermal oxide layer; a gate electrode disposed on the gate insulating layer; an interlayer insulating layer disposed on the gate electrode; and source and drain electrodes disposed on the interlayer insulating layer and electrically connected to source and drain regions of the semiconductor layer.

According to still another embodiment of the present invention, a method of fabricating a TFT includes: providing a substrate; forming an a-Si layer on the substrate; forming a thermal oxide layer to a thickness of about 10 to 50 Å on the a-Si layer; forming a metal catalyst layer for crystallization on the thermal oxide layer; annealing the substrate to crystallize the a-Si layer into a poly-Si layer using a metal catalyst of the metal catalyst layer for crystallization; removing the metal catalyst layer; patterning the thermal oxide layer and patterning the poly-Si layer to form a semiconductor layer; forming a gate insulating layer on the substrate having the semiconductor layer and the thermal oxide layer; forming a gate electrode on the gate insulating layer; forming an interlayer insulating layer on the gate electrode; and forming source and drain electrodes on the interlayer insulating layer to be electrically connected to source and drain regions of the semiconductor layer.

According to still another embodiment of the present invention, a method of fabricating a TFT includes: providing a substrate; forming a buffer layer on the substrate; forming a metal layer on the buffer layer and patterning the metal layer to form a gate electrode; forming a gate insulating layer on the gate electrode and buffer layer; forming an a-Si layer on the gate insulating layer; forming a thermal oxide layer to a thickness of about 10 to 50 Å on the a-Si layer; forming a metal catalyst layer on the thermal oxide layer;

annealing the substrate to crystallize the a-Si layer into a poly-Si layer using a metal catalyst of the metal catalyst layer; removing the metal catalyst layer and the thermal oxide layer; patterning the poly-Si layer to form a semiconductor layer; and forming and patterning source and drain electrodes on the semiconductor layer.

According to yet another aspect of the present invention, an OLED display device includes: a substrate; a semiconductor layer disposed on the substrate and crystallized using a metal catalyst for crystallization; a thermal oxide layer disposed on the semiconductor layer and having a thickness of about 10 to 50 Å; a gate insulating layer disposed on the thermal oxide layer; a gate electrode disposed on the gate insulating layer; an interlayer insulating layer disposed on the gate electrode; source and drain electrodes disposed on the interlayer insulating layer and electrically connected to source and drain regions of the semiconductor layer; a first electrode electrically connected to one of the source and drain electrodes; an organic layer disposed on the first electrode and including an emission layer (EML); and a second electrode disposed on the organic layer.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects of the invention will become apparent and more readily appreciated from the following description of the embodiments, taken in conjunction with the accompanying drawings of which:

FIG. 1A through 1C are cross-sectional views illustrating a process of fabricating a polycrystalline silicon (poly-Si) layer using a super grain silicon (SGS) crystallization method according to an embodiment of the present invention;

DETAILED DESCRIPTION OF THE EMBODIMENTS

Figure 1A:
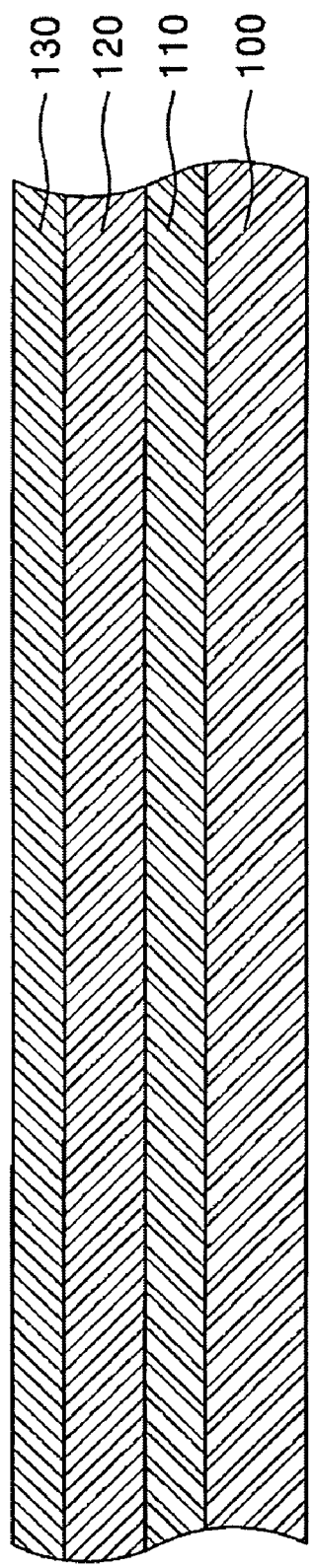

Reference will now be made in detail to the present embodiments of the present invention, examples of which are illustrated in the accompanying drawings, wherein like reference numerals refer to the like elements throughout. The embodiments are described below in order to explain the present invention by referring to the figures.

Figure 1B:
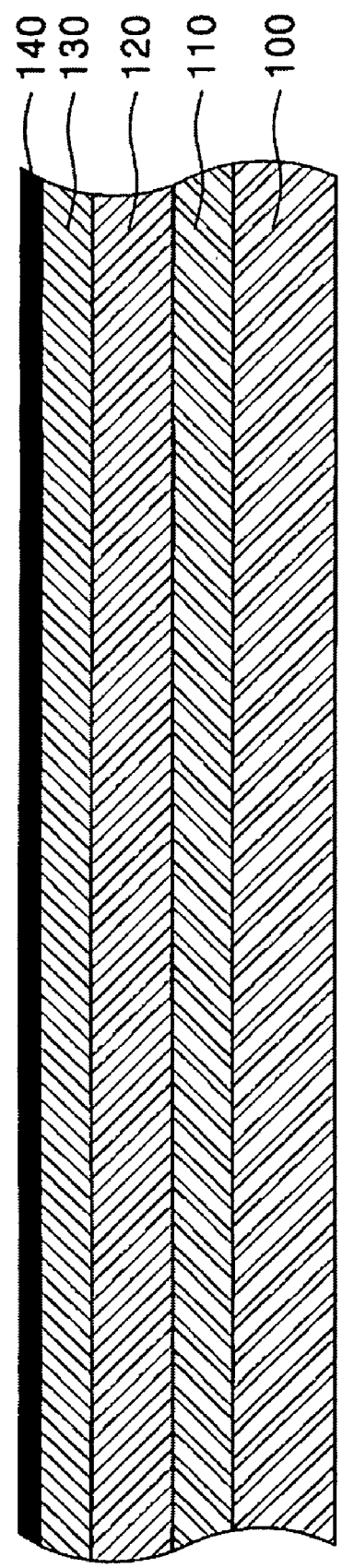

FIGS. 1A through 1C are cross-sectional views illustrating a process of forming a polycrystalline silicon (poly-Si) layer using a super grain silicon (SGS) crystallization method according to an embodiment of the present invention.

Referring to FIG. 1A, a substrate 100 is prepared. The substrate 100 may be formed of glass, stainless steel, or plastic. A buffer layer 110 is formed on the substrate 100 using a chemical vapor deposition (CVD) technique or a physical vapor deposition (PVD) technique. The buffer layer 110 may be a single layer or multiple insulating layers of silicon oxide layer and/or silicon nitride. The buffer layer 110 prevents the diffusion of moisture or impurities generated in the substrate 100 and/or controls the transmission rate of heat during a crystallization process, thereby facilitating the crystallization of the amorphous silicon (a-Si) layer.

Thereafter, an a-Si layer 120 is formed on the buffer layer 110. Typically, the a-Si layer 120 is formed using a CVD technique. The a-Si layer 120 formed using a CVD technique may contain a gas such as $H_2$ gas, in which can cause problems such as a reduction in electron mobility. Therefore, a dehydrogenation process may be performed such that $H_2$ does not remain in the a-Si layer 120.

Thereafter, a thermal oxide layer 130 is formed to a thickness of about 10 to 50 Å on the a-Si layer 120. The thermal oxide layer 130 may be obtained by thermally oxidizing the a-Si layer 120 in an atmosphere containing $O_2$ gas or moisture, and an inert gas. As a non-limiting example, the thermal oxidation may be performed at a temperature of about 400 to 700° C. It is difficult to cause thermal oxidation at temperatures Below 400° C., it may be difficult to achieve thermal oxidation; on the other hand, above 700° C., the substrate may become deformed during the thermal oxidation. The inert gas may be $N_2$ gas or Ar gas. When the thermal oxide layer 130 is formed in an $N_2$ atmosphere, the thermal oxide layer 130 may become densified.

As described above, the thermal oxide layer 130 may be formed to a thickness of about 10 to 50 Å. When the thermal oxide layer 130 has a thickness of less than about 10 Å, the thermal oxide layer 130 may not properly function as a capping layer to control the concentration of the metal catalyst that diffuses into the a-Si layer 120. As a result, crystallization of the a-Si layer 120 may be caused not by an SGS crystallization method but by an MIC method, resulting in smaller grains and possible contamination from excess metal catalyst in the formed poly-Si layer. On the other hand, if the thermal oxide layer 130 has a thickness of more than about 50 Å, only a small amount of metal catalyst diffuses into the a-Si layer 120, thereby reducing the number of crystal nuclei (or seeds). As a result, the a-Si layer 120 may be incompletely crystallized.

More specifically, the thermal oxide layer 130 may be formed to a thickness of about 17 to 26 Å. In this case, when the a-Si layer 120 is crystallized by diffusing the metal catalyst through the thermal oxide layer 130, the a-Si layer 120 may be completely crystallized by an SGS crystallization method, and the metal catalyst remaining in the crystallized poly-Si layer may be controlled to have a low concentration.

In general, when an oxide layer is separately formed by a CVD method or a PVD method, it is difficult in terms of processibility to form the oxide layer to a thickness of several tens of Å or less. Accordingly, the oxide layer must be formed to a thickness of several hundreds of Å in consideration of mass production. In this case, the oxide layer cannot have a uniform film quality as compared with the thermal oxide layer 130. Therefore, when the oxide layer is used as a capping layer for an SGS crystallization method, a metal catalyst for crystallization may be non-uniformly diffused into the a-Si layer 120. Thus, due to the great thickness of the oxide layer, the metal catalyst may not diffuse into the a-Si layer 120 or a region where the metal catalyst is not diffused to such a concentration as to form seeds may be formed. As a result, the a-Si layer 120 may not be uniformly crystallized during the SGS crystallization process.

By comparison, the thermal oxide layer 130, which is formed by thermally oxidizing the a-Si layer 120, has more uniform film quality than the oxide layer formed using a CVD technique or a PVD technique. Therefore, by the use of the thermal oxide layer 130, a metal catalyst for crystallization may be uniformly diffused into the a-Si layer 120. Also, since the thermal oxide layer 130 may be formed to a small thickness of about 10 to 50 Å, the metal catalyst may be diffused such that the a-Si layer 120 is completely crystallized by an SGS crystallization method.

Furthermore, the thermal oxide layer 130 may be formed at the same time as the dehydrogenation of the a-Si layer 120. In this case, an additional process of forming a capping layer may be omitted, thereby further simplifying the SGS crystallization process.

Referring to FIG. 1B, a metal catalyst is deposited on the thermal oxide layer 130, thereby forming a metal catalyst layer 140. As non-limiting examples, the metal catalyst may be one selected from the group consisting of Ni, Pd, Ti, Ag, Au, Al, Sn, Sb, Cu, Co, Mo, Tr, Ru, Rh, Cd, and Pt. As a specific example, the metal catalyst may be Ni. The metal catalyst layer 140 may be formed to an areal density of about $10^{11}$ to $10^{15}$ atoms/cm$^2$ on the thermal oxide layer 130. When the metal catalyst layer 140 is formed to an areal density lower than about $10^{11}$ atoms/cm$^2$, only a small number of seeds are formed, thereby reducing the likelihood of crystallization of the a-Si layer 120 into a poly-Si layer. When the metal catalyst layer 140 is formed to an areal density of more than about $10^{15}$ atoms/cm$^2$, the amount of the metal catalyst diffusing into the a-Si layer 120 is increased, thereby causing an MIC process rather than the SGS crystallization process. Also, the amount of the remaining metal catalyst is increased so that the characteristic of a semiconductor layer formed by patterning the poly-Si layer may be degraded.

Referring to FIG. 1C, the substrate 100 including the buffer layer 110, the a-Si layer 120, the thermal oxide layer 130, and the metal catalyst layer 140 is annealed (refer to 150) so that the a-Si layer 120 is crystallized using an SGS crystallization method. During the annealing process 150, only a small amount of metal catalyst 140b out of the metal catalysts 140a and 140b that diffuse through the thermal oxide layer 130 reaches the surface of the a-Si layer 120, whereas a large amount of the metal catalyst 140a neither reaches the a-Si layer 120 nor passes through the thermal oxide layer 130.

The metal catalyst 140b that passes through the thermal oxide layer 130 and diffuses into the surface of the a-Si layer 120 catalyzes the crystallizing of the a-Si layer 120 into a poly-Si layer 160. That is, the diffused metal catalyst 140b combines with Si of the a-Si layer 120 to form a metal silicide. The metal silicide forms seeds, thereby crystallizing the a-Si layer 120 into the poly-Si layer 160. The annealing process 150 may be performed using any one of a furnace process, a rapid thermal annealing (RTA) process, a ultraviolet (UV) process, and a laser process.

The annealing process 150 may be performed twice. Specifically, a primary annealing process includes moving the metal catalyst of the metal catalyst layer 140 to an interface between the thermal oxide layer 130 and the a-Si layer 120 to form seeds. A secondary annealing process includes crystallizing the a-Si layer 120 into the poly-Si layer 160 using the seeds. In this case, the primary annealing process may be performed at a temperature of about 200 to 800° C., and the secondary annealing process may be performed at a temperature of about 400 to 1300° C.

As illustrated in FIG. 1C, the annealing process 150 may be performed without removing the metal catalyst layer 140. However, as an alternative, the metal catalyst layer 140 may be removed after the primary annealing process so that additional diffusion or penetration of the metal catalyst can be prevented during the secondary annealing process.

In the poly-Si layer 160 obtained by crystallizing the a-Si layer 120 through the SGS crystallization method using the thermal oxide layer 130 and the metal catalyst layer 140, a metal catalyst is formed at a concentration of $1\times10^9$ to $1\times10^{13}$ atoms/cm$^2$ at a distance of about 100 Å from the top surface of the poly-Si layer 160 (i.e., from a contact surface between the poly-Si layer 160 and the thermal oxide layer 130) toward the substrate 100.

Figure 2A:
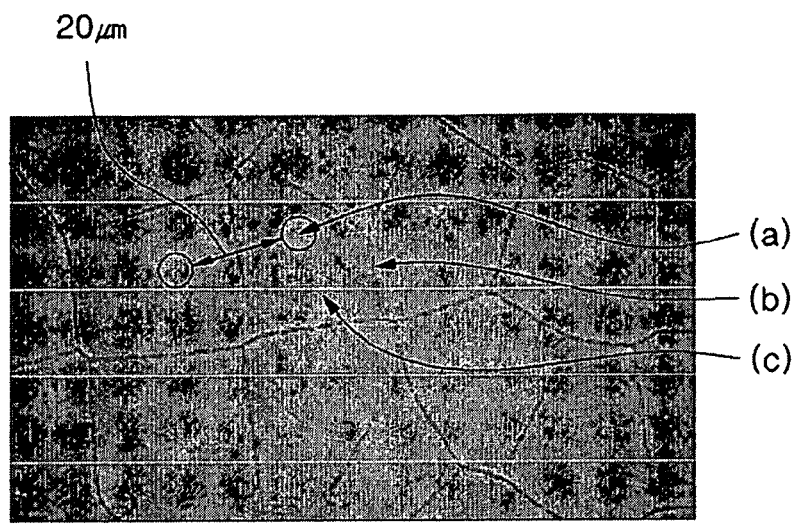
FIG. 2A is a photographic representation of a poly-Si layer crystallized using a method according the embodiment of FIGS. 1A through 1C.
Figure 2B:
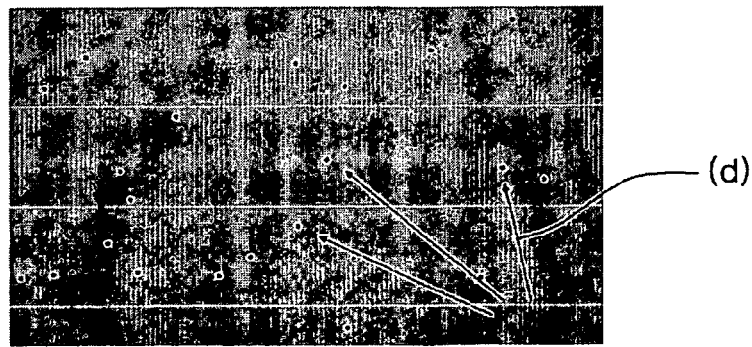
FIG. 2B is a photographic representation of a poly-Si layer fabricated when the thermal oxide layer is not formed.
Figure 2C:
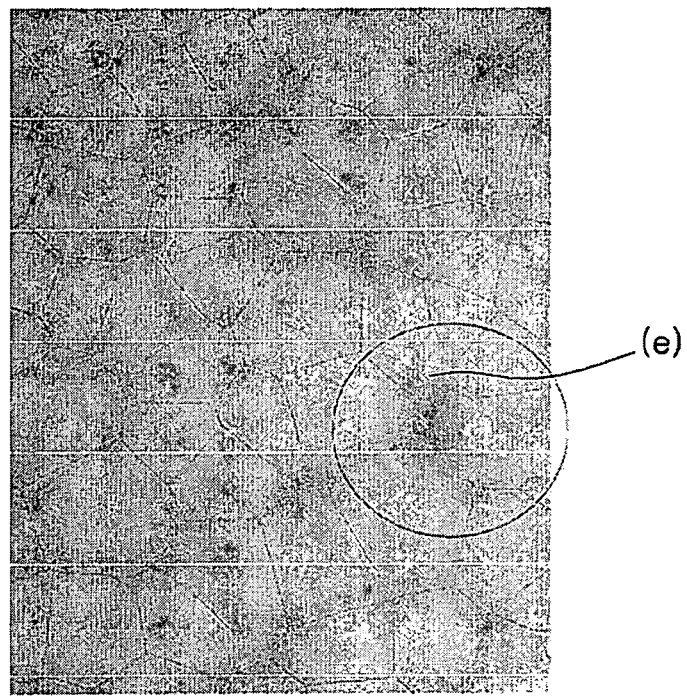
FIG. 2C is a photographic representation of a poly-Si layer fabricated when the thermal oxide layer has a thickness of more than 50 Å.
Figure 2D:
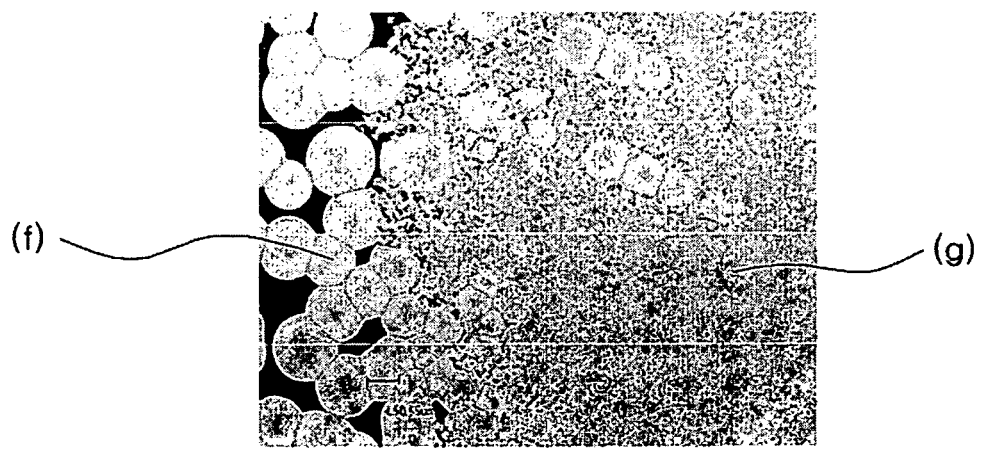
FIG. 2D is a photographic image of a poly-Si layer fabricated when an oxide layer of several hundreds of angstroms is formed on an a-Si layer using a chemical vapor deposition (CVD) technique.

FIG. 2A is a photograph of a poly-Si layer crystallized by the method according to FIGS. 1A to 1C. FIG. 2B is a photograph of a poly-Si layer fabricated when the thermal oxide layer 130 is not formed or has a thickness of less than about 10 Å. FIG. 2C is a photograph of a poly-Si layer fabricated when the thermal oxide layer 130 has a thickness of more than 50 Å. FIG. 2D is a photograph of a poly-Si layer fabricated when an oxide layer is formed on an a-Si layer using a CVD or PVD technique.

FIG. 2A shows the poly-Si layer fabricated by the method described above according to FIGS. 1A to 1C. That is, when the thermal oxide layer 130 is formed to a thickness of about 10 to 50 Å on the a-Si layer 120 and the a-Si layer 120 is crystallized by an SGS crystallization method, the poly-Si layer is formed as exemplified in FIG. 2A.

Referring to FIG. 2A, the poly-Si layer includes crystal grains with a size of about 20 μm. In other words, the interval between seeds is about 20 μm. Also, it can be confirmed that a seed (a) is present in the center of a crystal grain, a crystal grain boundary (b) is present between adjacent crystal grains, and a crystallized region (c) is present between the seed (a) and the crystal grain boundary (b) in the poly-Si layer fabricated by the SGS crystallization method. The seed (a), the crystal grain boundary (b), and the region (c) have different crystallinities. Therefore, in the method of fabricating the poly-Si layer according to the present embodiment, it can be seen that the a-Si layer 120 is crystallized by the SGS crystallization method.

As a comparative example, FIG. 2B shows a poly-Si layer fabricated when the thermal oxide layer 130 is not formed.

Referring to FIG. 2B, a crystal grain boundary cannot be confirmed in the poly-Si layer, and it can be observed that metal silicide conglomerates (d) are uniformly distributed in the poly-Si layer. Accordingly, it can be seen that the poly-Si layer formed without forming a thermal layer has the same characteristics as a poly-Si layer obtained by an MIC method. (A poly-Si layer fabricated using a thermal oxide layer having a thickness of less than 10 Å on the a-Si layer 120 would have the same structure as the poly-Si layer of FIG. 2B.)

As another comparative example, FIG. 2C shows a poly-Si layer fabricated when a thermal oxide layer 130 is formed on the a-Si layer 120 to a thickness of about 100 Å, instead of being formed to a thickness of 10 to 50 Å, and the a-Si layer 120 is crystallized.

Referring to FIG. 2C, since only a small amount of metal catalyst diffuses into the a-Si layer 120, the number of seeds is reduced. As a result, the a-Si layer 120 is incompletely crystallized, and a region (e) exists where an SGS crystallization region is mixed with an SPC crystallization region (that is, a region that is crystallized by heat only). As compared with the poly-Si layer shown in FIG. 2A, which is completely crystallized by the SGS crystallization method, the poly-Si layer shown in FIG. 2C includes the region (e) where the SGS crystallization region is mixed with the SPC crystallization region so that an unclear crystal grain boundary is formed.

As still another comparative example, FIG. 2D shows the poly-Si layer fabricated when an oxide layer is deposited on the a-Si layer 120 to a thickness of several hundreds of Å using a CVD technique and the a-Si layer 120 is crystallized.

Referring to FIG. 2D, the oxide layer is non-uniformly formed so that metal catalysts are non-uniformly diffused into the a-Si layer 120. Thus, the poly-Si layer includes not only an SGS crystallization region (f) but also a region (g) where an MIC-type crystallization region is mixed with an SGS crystallization region.

Therefore, according to aspects of the present invention, it can be seen that when the thermal oxide layer 130 is formed to a thickness of about 10 to 50 Å on the a-Si layer 120 and the metal catalyst layer 140 is formed on the thermal oxide layer 130, the a-Si layer 120 may be crystallized by an SGS crystallization method. Also, when the thermal oxide layer 130 is formed during the dehydrogenation of the a-Si layer 120, an additional process of forming a capping layer may be omitted, thereby simplifying the fabrication process of the poly-Si layer.

FIGS. 3A through 3D are cross-sectional views illustrating a process of fabricating a top-gate TFT using the method of fabricating a poly-Si layer according to FIGS. 1A to 1C. The process of fabricating the top-gate TFT will now be described with reference to the method shown in FIGS. 1A through 1C, except for particulars mentioned below.

Figure 3A:
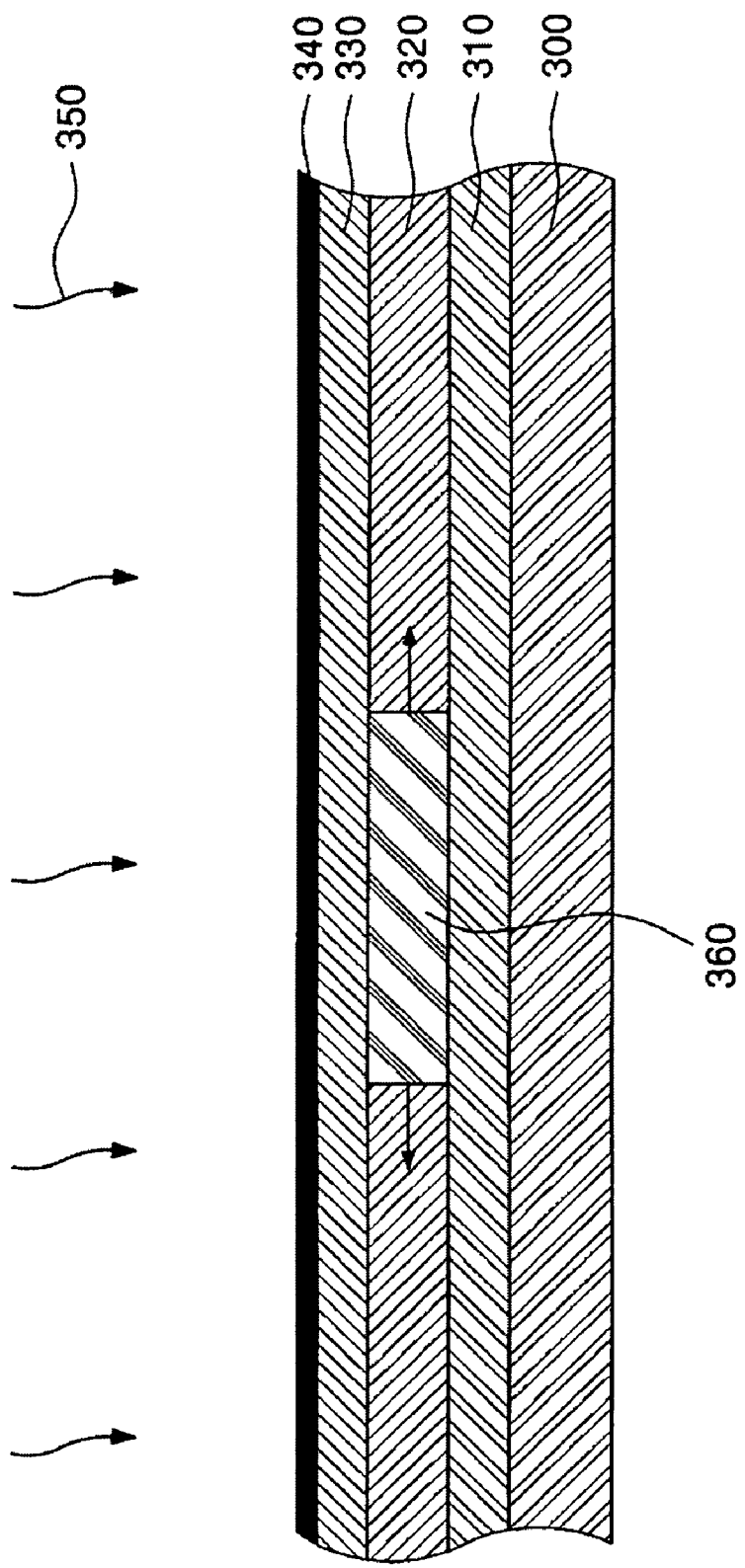
FIGS. 3A through 3D are cross-sectional views illustrating a process of fabricating a top-gate thin film transistor (TFT) using a method of fabricating a poly-Si layer according to FIGS. 1A through 1C.

Referring to FIG. 3A, a buffer layer 310 is formed on a substrate 300 formed of glass, stainless steel, or plastic. Thereafter, an a-Si layer 320, a thermal oxide layer 330, and a metal catalyst layer 340 are formed on the buffer layer 310 and then annealed (refer to 350) so that the a-Si layer 320 is crystallized into a poly-Si layer 360 by an SGS crystallization method.

Figure 3B:
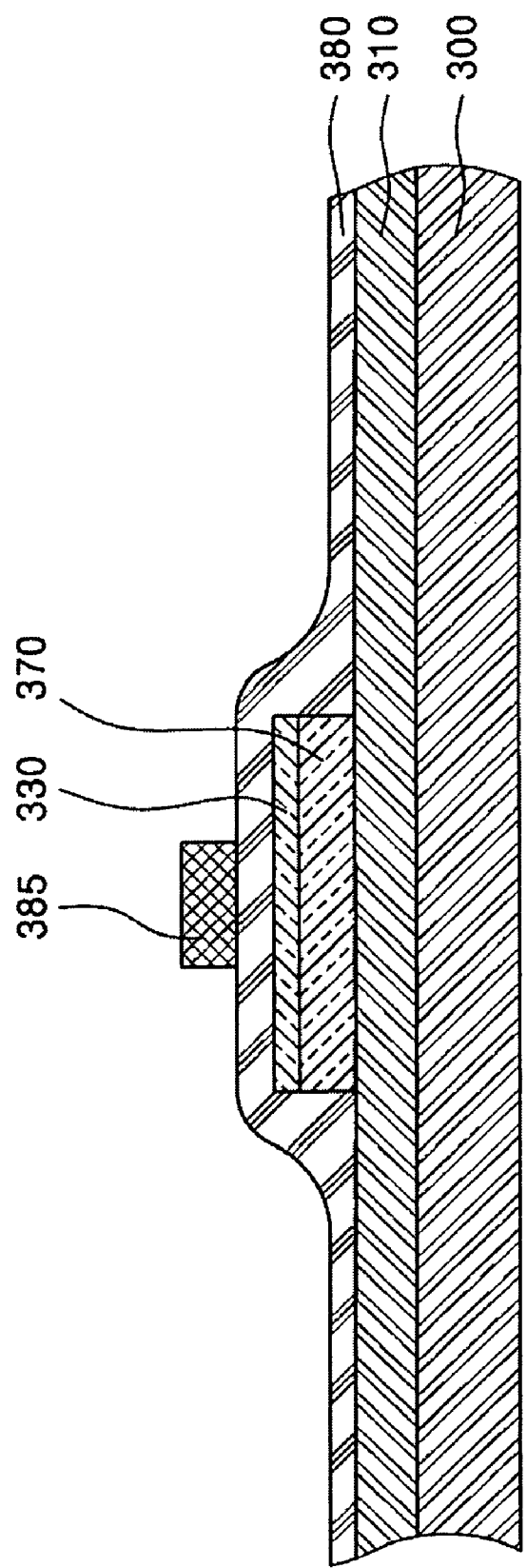

Referring to FIG. 3B, the metal catalyst layer 340 shown in FIG. 3A is removed, and the poly-Si layer 360 and the thermal oxide layer 330 shown in FIG. 3A are patterned. The patterned poly-Si layer becomes a semiconductor layer 370 of a TFT as shown in FIG. 3B. Alternatively, the poly-Si layer 360 and the thermal oxide layer 330 may be patterned in a subsequent process.

Thereafter, a gate insulating layer 380 is formed on the entire surface of the substrate 300. The gate insulating layer 380 may be a silicon oxide layer, a silicon nitride layer, or a combination thereof. In the current embodiment, the thermal oxide layer 330 is not removed, and the gate insulating layer 380 is formed on the thermal oxide layer 330. In this case, the thermal oxide layer 330 functions as an insulating layer that electrically insulates the semiconductor layer 370 from a gate electrode that will be formed later. The thermal oxide layer 330 has a lower defect density than an oxide layer formed using a CVD technique or a PVD technique and has a uniform film quality. Therefore, when the thermal oxide layer 330 is not removed but is left on the semiconductor layer 370, the insulation of the semiconductor layer 370 from the gate electrode can be further improved. Alternatively, the thermal oxide layer 330 may be removed and the gate insulating layer 380 may be formed to contact the semiconductor layer 370.

Subsequently, a metal layer (not shown) for a gate electrode is formed on the gate insulating layer 380. The metal layer may be a single layer formed of an Al alloy such as aluminum-neodymium (Al—Nd), or a combination obtained by stacking an Al alloy on a Cr or Mo alloy. The metal layer for the gate electrode is etched using photolithography and etching processes, thereby forming a gate electrode 385 corresponding to a channel region of the semiconductor layer 370.

Figure 3C:
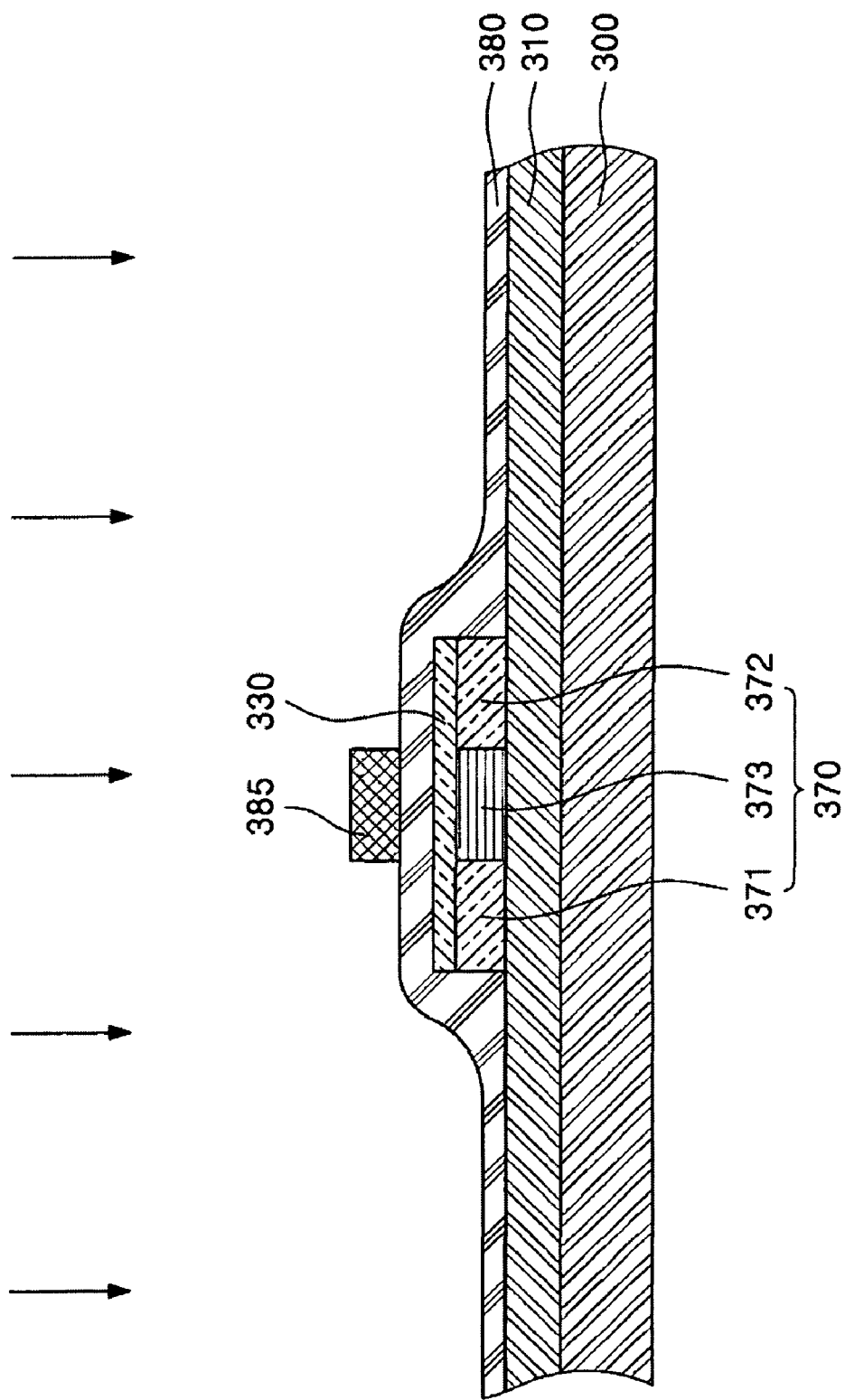

Referring to FIG. 3C, conductive impurity ions are doped using the gate electrode 385 as a mask, thereby forming a source region 371 and a drain region 372 in the semiconductor layer 370. The impurity ions may be p-type ions or n-type ions. The p-type ions may be selected from the group consisting of boron (B), aluminum (Al), gallium (Ga), and indium (In), and the n-type ions may be one selected from the group consisting of phosphorus (P), antimony (Sb), and arsenic (As). An undoped region interposed between the source region 371 and the drain region 372 functions as a channel region 373. As an alternative to carrying out the using of the formed gate electrode as a mask, the doping process may be performed before the gate electrode 385 is formed using a photoresist.

Figure 3D:
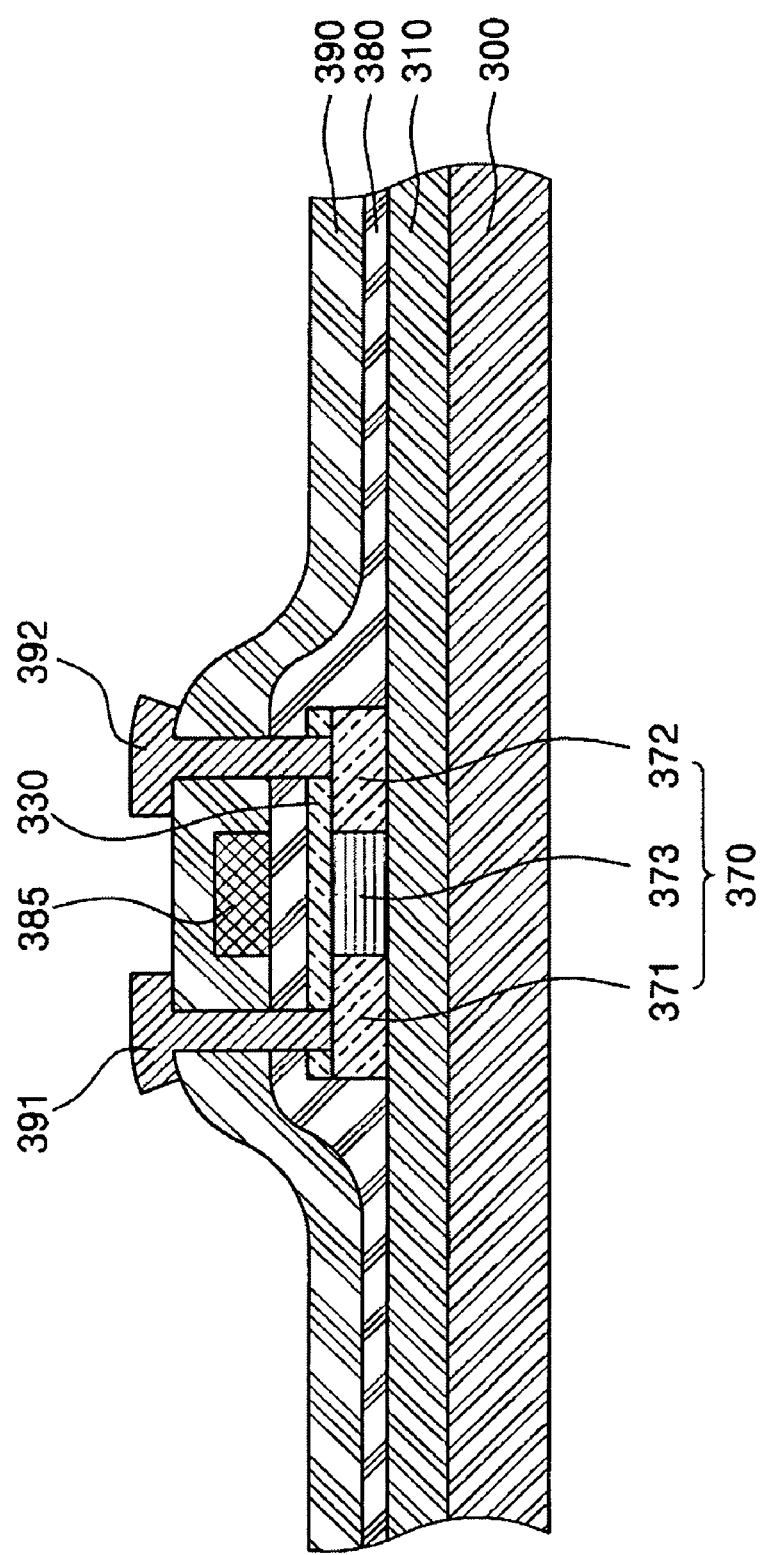

Referring to FIG. 3D, an interlayer insulating layer 390 is formed on the entire surface of the substrate 300 including the gate electrode 385. The interlayer insulating layer 390 may be a silicon nitride layer, a silicon oxide layer, or a combination thereof.

Thereafter, the interlayer insulating layer 390, the gate insulating layer 380, and the thermal oxide layer 330 are etched, thereby forming a contact hole exposing the source and drain regions 371 and 372 of the semiconductor layer 370. After that, source and drain electrodes 391 and 392 are formed to be respectively connected to the source and drain regions 371 and 372 through contact holes. The source and drain electrodes 391 and 392 may be formed of one selected from the group consisting of molybdenum (Mo), chrome (Cr), tungsten (W), aluminum-neodymium (Al—Nd), titanium (Ti), tungsten molybdenum (MoW), and aluminum (Al). Thus, the top-gate TFT including the semiconductor layer 370, the gate electrode 385, and the source and drain electrodes 391 and 392 is completed.

Figure 4A:
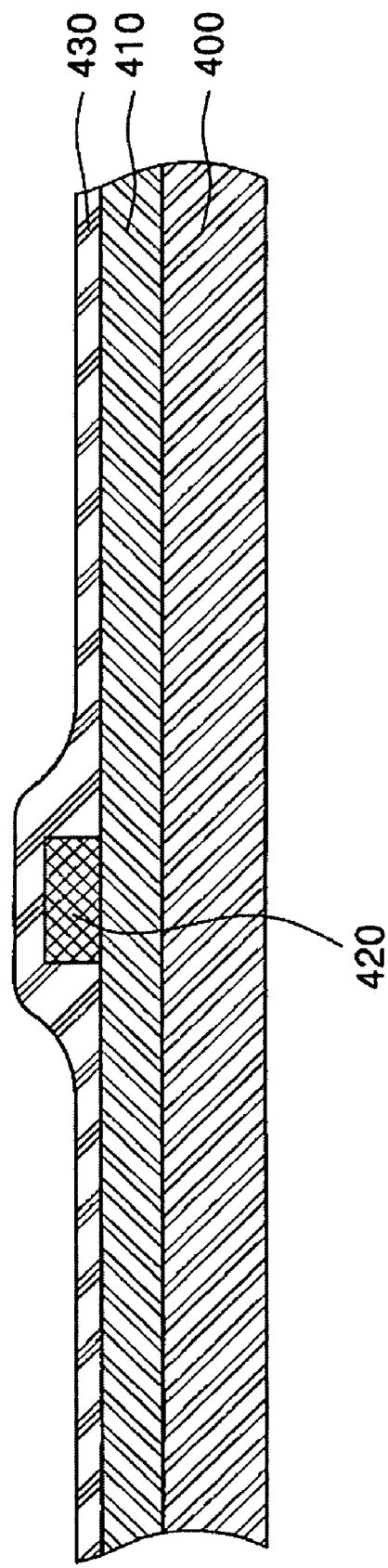
FIGS. 4A through 4C are cross-sectional views illustrating a process of fabricating a bottom-gate TFT using a method of fabricating a poly-Si layer according to FIGS. 1A through 1C.
Figure 4B:
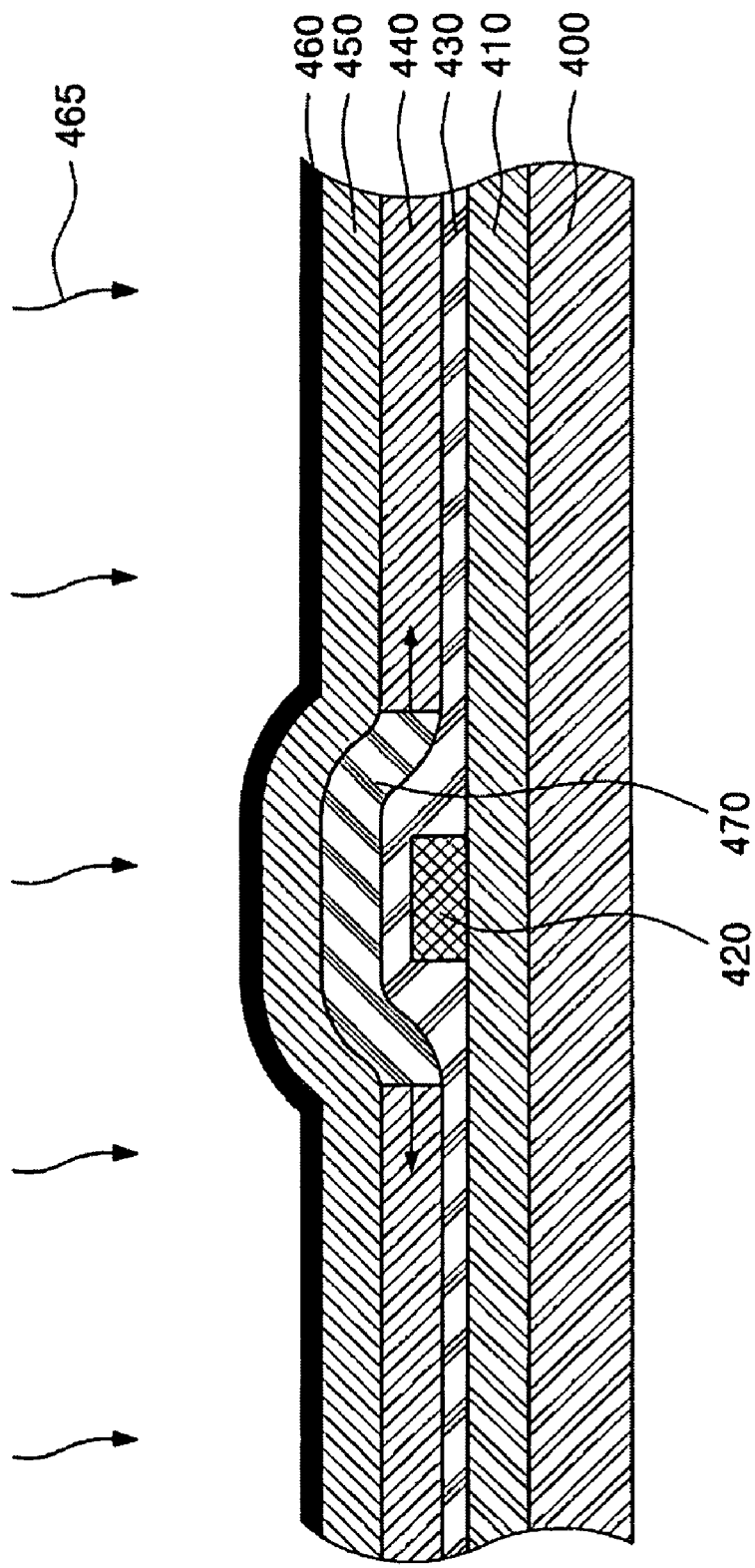
Figure 4C:
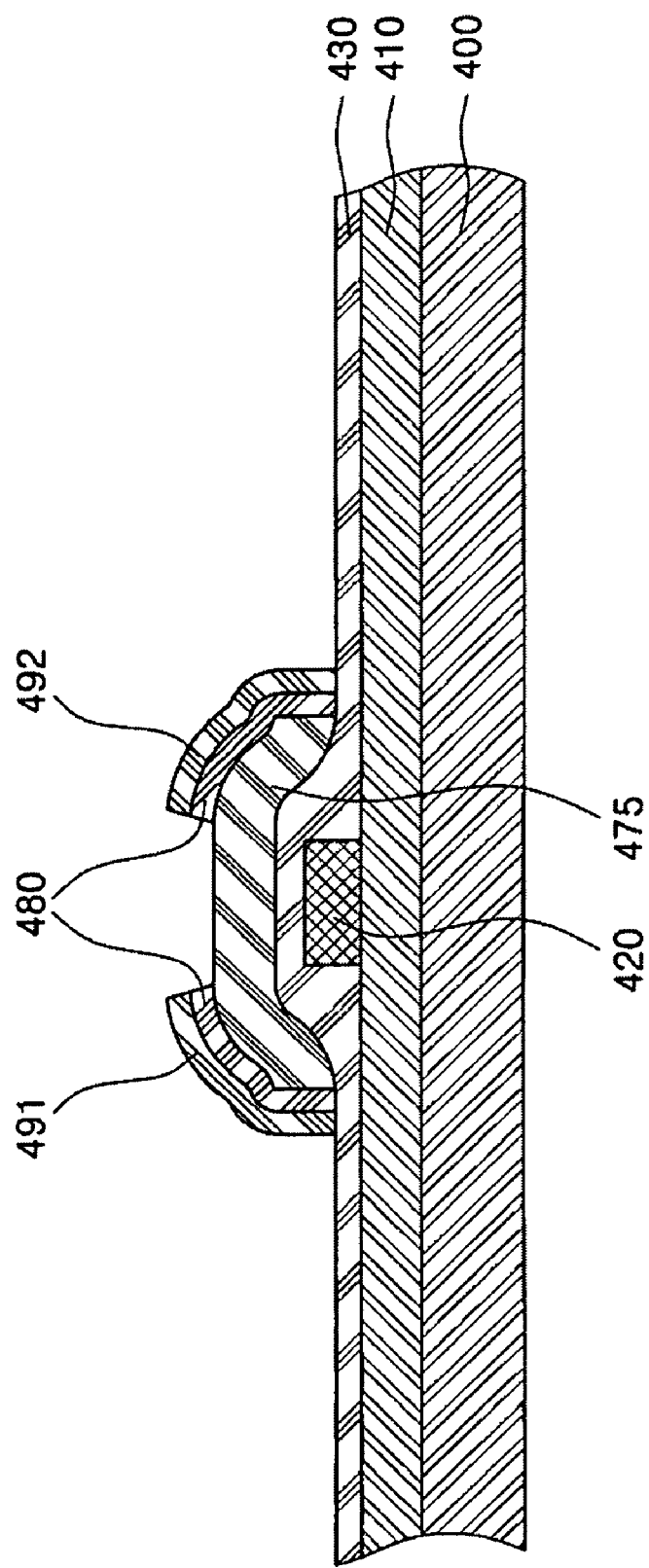

FIGS. 4A through 4C are cross-sectional views illustrating a process of fabricating a bottom-gate TFT using the method of fabricating a poly-Si layer according to an the embodiment shown in FIGS. 1A through 1C. The process of fabricating the bottom-gate TFT will now be described with reference to the method shown in FIGS. 1A through 1C, except for particulars mentioned below.

Referring to FIG. 4A, a buffer layer 410 is formed on a substrate 400. A metal layer (not shown) for a gate electrode is formed on the buffer layer 410 and then, the metal layer is etched using photolithography and etching processes, thereby forming a gate electrode 420. Thereafter, a gate insulating layer 430 is formed on the substrate 400 having the gate electrode 420.

Referring to FIG. 4B, an a-Si layer 440 is formed on the gate insulating layer 430, and a thermal oxide layer 450 is formed to a thickness of about 10 to 50 Å on the a-Si layer 440. When the thermal oxide layer 450 is formed during the dehydrogenation of the a-Si layer 440, an additional process of forming a capping layer required for crystallizing the a-Si layer 440 using an SGS crystallization method can be omitted, thereby simplifying the fabrication process.

A metal catalyst layer 460 is formed on the thermal oxide layer 450 and then annealed so that the a-Si layer 440 is crystallized into a poly-Si layer 470 by an SGS crystallization method.

Referring to FIG. 4C, the metal catalyst layer 460 and the thermal oxide layer 450 shown in FIG. 4B are removed, and the poly-Si layer 470 is patterned. The patterned poly-Si layer becomes a semiconductor layer 475 of a TFT. Alternatively, the metal catalyst layer 460 and the thermal oxide layer 450 may be removed after a primary annealing process in which a metal catalyst of the metal catalyst layer 460 moves to an interface between the thermal oxide layer 450 and the a-Si layer 440 to form seeds.

Thereafter, an ohmic contact material layer and a source/drain conductive layer are sequentially stacked on the semiconductor layer 475. The source/drain conductive layer and the ohmic contact material layer are sequentially patterned, thereby forming source and drain electrodes 491 and 492 and an ohmic contact layer 480. The ohmic contact layer 480 may be a doped a-Si layer.

In order to reduce the number of masks used in forming the TFT, the source/drain conductive layer and the ohmic contact layer may be patterned using a single mask. In this case, the ohmic contact layer 480 may be disposed under the entire bottom surfaces of the source and drain electrodes 491 and 492. The ohmic contact layer 480 is interposed between the semiconductor layer 475 and the source and drain electrodes 491 and 492 so that the source and drain electrodes 491 and 492 can be in ohmic contact with the semiconductor layer 475. Alternatively, the ohmic contact layer 480 may be omitted. In this case, before the source/drain conductive layer is stacked, a conductive region may be formed on the semiconductor layer 475 so that the semiconductor layer 475 can be in ohmic contact with the source and drain electrodes 491 and 492. As a result, the bottom-gate TFT including the gate electrode 420, the semiconductor layer 475, and the source and drain electrodes 491 and 492 is completed.

It is to be understood that the TFT and the method of forming the TFT according to aspects of the present invention is not limited to what is described above, and that any structure or method including a semiconductor layer formed by forming a thermal oxide layer having a thickness of about 10 to 50 Å and a metal catalyst layer on amorphous silicon and crystallizing the amorphous silicon using the metal catalyst of the metal catalyst layer may be used.

Figure 5:
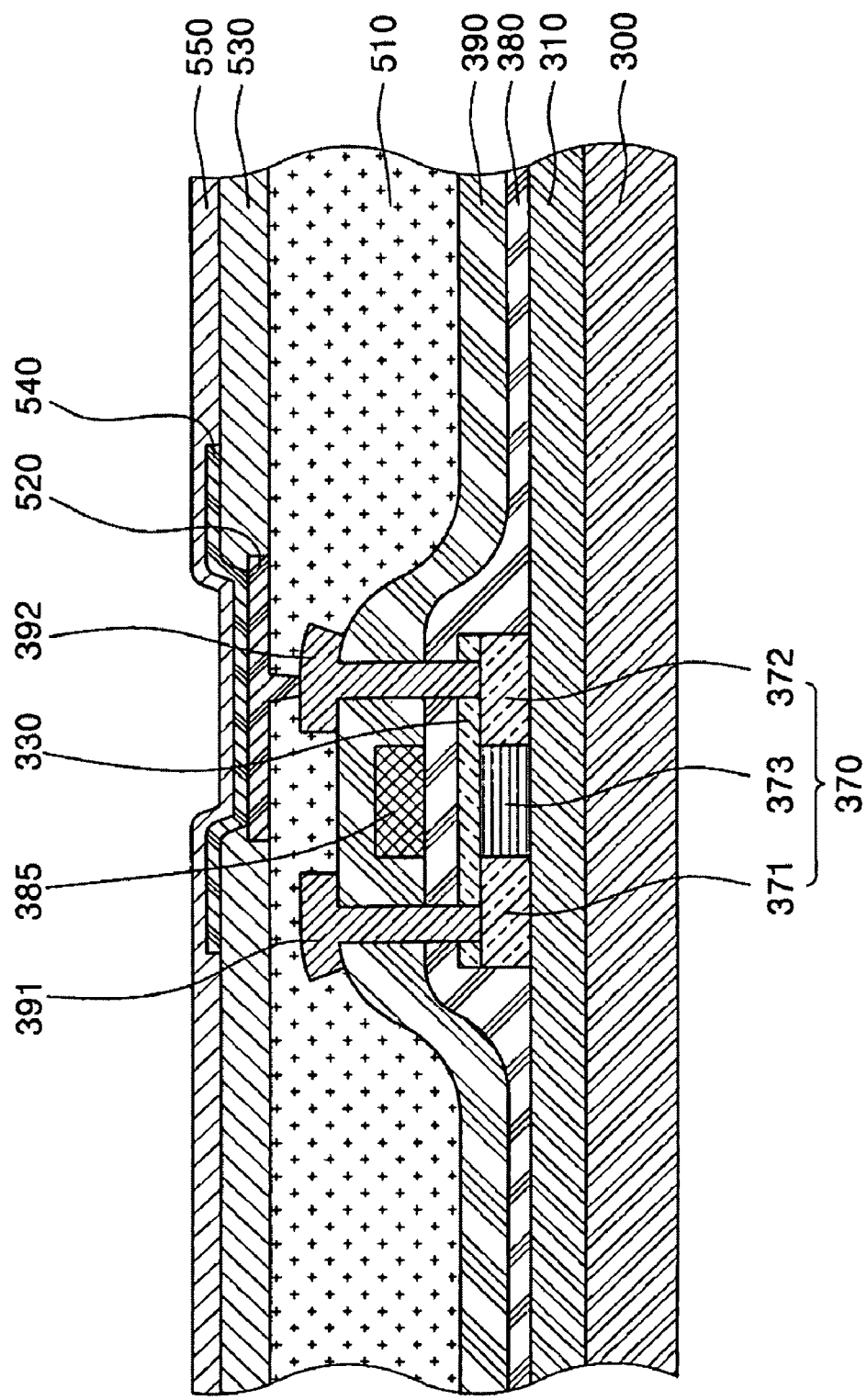
FIG. 5 is a cross-sectional view of an organic light emitting diode (OLED) display device including a top-gate TFT according to an embodiment of the present invention.

FIG. 5 is a cross-sectional view of an organic light emitting diode (OLED) display device including a top-gate TFT according to an exemplary embodiment of the present invention.

Referring to FIG. 5, an insulating layer 510 is formed on the entire surface of the substrate 300 including the TFT shown in FIG. 3D. The insulating layer 510 may be an inorganic layer or an organic layer. The inorganic layer may be one selected from the group consisting of a silicon oxide layer, a silicon nitride layer, and a silicon-on-glass (SOG) layer, and the organic layer may be formed of one selected from the group consisting of polyimide, benzocyclobutene series resin (BCB resin), and acrylate. Also, the insulating layer 510 may be a stack structure of the inorganic layer and the organic layer.

The insulating layer 510 may be etched, thereby forming a via hole exposing one of the source and drain electrodes 391 and 392. A first electrode 520 is formed to be connected to one of the source and drain electrodes 391 and 392 through the via hole. The first electrode 520 may be formed as an anode or a cathode. When the first electrode 520 is an anode, the anode may be formed using a transparent conductive layer formed of one of indium tin oxide (ITO), indium zinc oxide (IZO), and indium tin zinc oxide (ITZO). When the first electrode 520 is a cathode, the cathode may be formed of one selected from the group consisting of Mg, Ca, Al, Ag, Ba, and an alloy thereof.

Thereafter, a pixel defining layer 530 is formed on the first electrode 520 to have an opening exposing a portion of the surface of the first electrode 520, and an organic layer 540 having an emission layer (EML) is formed on the exposed portion of the first electrode 520. The organic layer 540 may further include at least one selected from the group consisting of a hole injection layer (HIL), a hole transport layer (HTL), a hole blocking layer (HBL), an electron blocking layer (EBL), an electron injection layer (EIL), and an electron transport layer (ETL). Subsequently, a second electrode 550 is formed on the organic layer 540. Thus, an OLED display device according to the present embodiment is completed.

It is to be understood that the organic light emitting diode and the method of forming the TFT according to aspects of the present invention is not limited to what is described above, and that any structure or method including a semiconductor layer formed by forming a thermal oxide layer having a thickness of about 10 to 50 Å and a metal catalyst layer on amorphous silicon and crystallizing the amorphous silicon using the metal catalyst of the metal catalyst layer may be used.

Therefore, a thermal oxide layer is formed to a thickness of about 10 to 50 Å on an a-Si layer so that the a-Si layer can be crystallized into a poly-Si layer by an SGS crystallization method. Also, the thermal oxide layer may be formed during the dehydrogenation of the a-Si layer so that an additional process of forming a capping layer required for the SGS crystallization method can be omitted, thereby simplifying the fabrication process. Furthermore, the thermal oxide layer having a good insulation characteristic may be kept rather than removed and may be used to electrically insulate a semiconductor layer from a gate electrode, thereby improving the insulation characteristic of the semiconductor layer from the gate electrode.

According to aspects of the present invention as described above, an a-Si layer can be crystallized into a poly-Si layer by an SGS crystallization method. Also, an additional process of forming a capping layer can be omitted, thereby simplifying the fabrication process of the poly-Si layer.

Although a few embodiments of the present invention have been shown and described, it would be appreciated by those skilled in the art that changes may be made in this embodiment without departing from the principle and spirit of the invention, the scope of which is defined in the claims and their equivalents.

What is claimed is:

1. A thin film transistor (TFT) comprising:
a substrate;
a semiconductor layer disposed on the substrate and crystallized using a metal catalyst;
a thermal oxide layer disposed on the semiconductor layer and having a thickness of about 10 Å to 50 Å;
a gate insulating layer disposed on the thermal oxide layer;
a gate electrode disposed on the gate insulating layer;
an interlayer insulating layer disposed on the gate electrode; and
source and drain electrodes disposed on the interlayer insulating layer and electrically connected to source and drain regions of the semiconductor layer,
wherein the semiconductor layer includes the metal catalyst in a concentration of $1\times10^9$ to $1\times10^{13}$ atoms/cm$^2$ in the semiconductor layer at a distance of about 100 Å from a contact surface between the semiconductor layer and the thermal oxide layer.

2. The TFT according to claim 1, wherein the thermal oxide layer has a thickness of about 17 Å to 26 Å.

3. The TFT according to claim 1, wherein the semiconductor layer is crystallized by a super grain silicon (SGS) crystallization method.

4. An organic light emitting diode (OLED) display device comprising:
a substrate;
a semiconductor layer disposed on the substrate and crystallized using a metal catalyst;
a thermal oxide layer disposed on the semiconductor layer and having a thickness of about 10 Å to 50 Å;
a gate insulating layer disposed on the thermal oxide layer;
a gate electrode disposed on the gate insulating layer;
an interlayer insulating layer disposed on the gate electrode;
source and drain electrodes disposed on the interlayer insulating layer and electrically connected to source and drain regions of the semiconductor layer;
a first electrode electrically connected to one of the source and drain electrodes;
an organic layer disposed on the first electrode and including an emission layer (EML); and
a second electrode disposed on the organic layer.

5. The OLED display device according to claim 4, wherein the thermal oxide layer has a thickness of about 17 Å to 26 Å.

6. The OLED display device according to claim 4, wherein the metal catalyst for crystallization is formed at a concentration of $1\ 10^9$ to $1\ 10^{13}$ atoms/cm$^2$ in the semiconductor layer at a distance of about 100 Å from a contact surface between the semiconductor layer and the thermal oxide layer toward the substrate.

7. The OLED display device according to claim 4, wherein the semiconductor layer is crystallized by an SGS crystallization method.

* * * * *